DIODE PULSE GATING CIRCUIT

Original Filed Jan. 22, 1959

INVENTOR.
Richard K. Richards
BY
Norman C. Fulmer
Att'y.

United States Patent Office

Re. 25,867
Reissued Sept. 21, 1965

25,867
DIODE PULSE GATING CIRCUIT

Richard K. Richards, 1821 Allen Ave., Ames, Iowa

Original No. 3,013,163, dated Dec. 12, 1961, Ser. No. 788,418, Jan. 22, 1959. Application for reissue June 10, 1963, Ser. No. 287,176
11 Claims. (Cl. 307—88.5)

Matter enclosed in heavy brackets [ ] appears in the original patent but forms no part of this reissue specification; matter printed in italics indicates the additions made by reissue.

This invention relates to logical circuits of the type used in digital computers. More specifically, it relates to a circuit for selectively gating a pulse signal under the control of a relatively steady-state type of signal or under the control of a logical combination of several such steady-state types of signals.

Diode "and" and "or" circuits are well known to the prior art. Also, means are known for using diodes in combination with other components to gate a pulse signal under the control of other signals. However, the obvious combinations of such circuits result in circuits which have one or more of the following disadvantages: they require accurate control of signal levels and accurate control of component parameters for reliable operation; they are limited in the logical combinations which can be used practically; they require a very high reverse-to-forward resistance ratio of the diodes; and they produce excessive loading on the circuits providing the pulse or steady-state signals.

It is an object of this invention to provide a diode pulse gating circuit which avoids the problems enumerated above. The major intended application of the circuit of this invention is in the control of a set of flip-flops in a systematic step-by-step manner; that is, at the beginning of each time step, the set of flip-flops exists in a particular combination of stable states. The combination of stable states in which the flip-flops are to exist at the beginning of the next succeeding time step is a logical function of the first combination of stable states. The diode circuits form a logical representation of the relationship between successive combinations of the aforesaid stable states of the flip-flops. At each time-step, an actuating pulse (commonly called a clock pulse) is applied to the circuits in such a manner that this pulse is "gated" to the appropriate flip-flops to cause them to change state as called for by the logical representation relating the successive combinations of stable states. It is this mode of operation which forms the basis of design for many types of digital computers and other digital systems. Inasmuch as the input gating signals to a given gate circuit are supplied by flip-flops which may be actuated by the output pulse from the same gate circuit (or supplied by other flip-flops actuated at the same time), it is a further object of this invention that a binary input signal can change at the time of an actuating pulse, with the gating operation functioning in accordance only with the values of the gating signals present at the beginning of the actuating pulse.

The objects of this invention are achieved by a novel interconnection of diodes which combines biasing, clamping, gating, and logical functions in a simple and reliable manner.

The various objects which have been mentioned, as well as other objects, are achieved by the invention which is disclosed in the following description and claims, and in the figures of the drawing which show diode pulse gating circuits in accordance with preferred embodiments of the invention.

Figure 1:
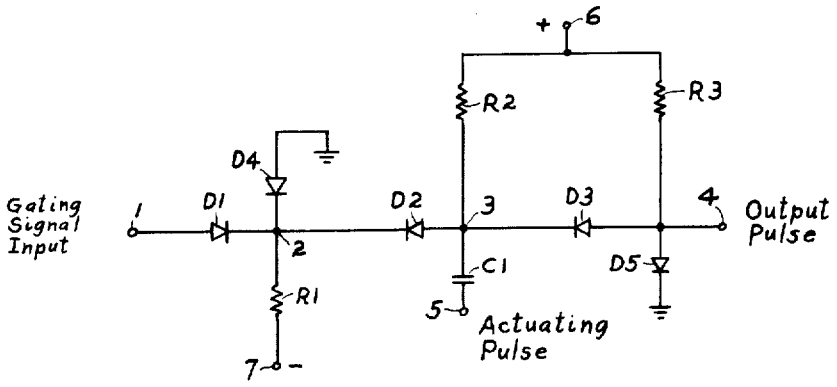
FIG. 1 is a circuit diagram of a diode pulse gating circuit.

In FIGURE 1, a diode D1 is connected between an input terminal 1 and a point 2, the polarity of connection being such that the anode and cathode of the diode are connected to terminal 1 and to point 2, respectively. With this connection the low-resistance path is for current flow from 1 to 2 (low resistance to electron flow is in the opposite direction). The anode and cathode of a diode D4 are connected to ground and to the point 2, respectively. A resistor R1 is connected between the point 2 and a source of negative supply voltage at a terminal 7. The anode and cathode of a diode D2 are connected to a point 3 and to the point 2, respectively. A resistor R2 is connected between the point 3 and a source of positive supply voltage at terminal 6. A capacitor C1 is connected between the point 3 and a terminal 5. The anode and cathode of a diode D3 are connected to an output terminal 4 and to the point 3, respectively. A resistor R3 is connected between the terminals 4 and 6. The anode and cathode of a diode D5 are connected to the terminal 4 and to ground, respectively.

For an explanation of the operation of the gating circuit of FIG. 1, attention is first directed to the components R3 and D5. Current normally flows from terminal 6 through resistor R3 and diode D5 to ground. Because of the low forward resistance of D5, the potential of terminal 4 is held substantially at ground potential. Diode D5 prevents the potential from becoming more positive than ground, although if a negative signal of sufficient amplitude is applied through D3, the potential at terminal 4 can be caused to become negative with respect to ground.

Next, consider components R2, D2, D3, and C1. If the potential of point 2 is at ground, due to current flow through diode D4 and resistor R1, the potential at point 3 will also be at ground because of current flowing from terminal 6 through resistor R2 and through diode D2 in the low-resistance direction. A negative actuating pulse now applied at terminal 5 will be electrostatically coupled through capacitor C1 to point 3. If the fall time of the actuating pulse is sufficiently fast relative to the values of the various circuit parameters, the potential of point 3 will be driven negative. A negative potential at point 3 will be transmitted through the low-resistance direction of diode D3 and will cause the potential of the output terminal 4 to become negative. When the actuating pulse returns to its normal relatively positive potential (or sooner if the capacitance of C1 is relatively small so that it discharges before this time) the potential of point 3 and terminal 4 will return to ground value. The actuating pulse thus will have been gated from terminal 5 to terminal 4.

On the other hand, if the potential of point 1 were initially at some positive value (but in practice less positive than the supply voltage at terminal 6), the potential at point 3 would be substantially the same positive value, and a reverse voltage would appear across diode D3 thereby rendering it non-conductive. Should the negative actuating pulse be applied to terminal 5 with the circuit in this condition, there will be no signal transmitted from terminal 5 to terminal 4 because of the high resistance presented by diode D3. The amplitude of the actuating pulse must not, of course, be excessively large in comparison with the magnitude of the positive potential at point 2. However, it is found that the requirements on maximum pulse amplitude are not particularly stringent because, to pull the potential of terminal 4 negative, it is first necessary that the actuating pulse cause all of the current flowing through resistor R3 to be directed through diode D3 to point 3 instead of through diode D5 to ground. It is this feature which causes unwanted pulses to be eliminated from the output terminal substantially completely when the gate is in this condition.

The current from ground through the low-resistance direction of diode D4 and then through resistor R1 to the negative supply voltage terminal 7 causes the potential at point 2 to be prevented from becoming more negative than ground. If the potential at point 2 were negative with respect to ground, there would be a low-resistance path through diodes D2 and D3 to output terminal 4 which would cause an unwanted negative excursion of the potential at terminal 4. A positive signal applied at the input terminal 1 can, however, cause the potential at point 2 to become positive because of the low-resistance path provided by diode D1. Note that the current through resistor R2 must pass through resistor R1; therefore, for the desired action the resistance of R1 must be sufficiently small relative to the resistance of R2.

From the above description it may be observed that the amplitude requirements on the input gating signal are not stringent. When gating a pulse, the input potential may be allowed to drop much more negative than ground; the only effect will be to cause the potentials across diode D1 to appear in the reverse (non-conducting) direction. When not gating a pulse, the input potential must be sufficiently positive to cause a sufficiently large reverse voltage to appear across diode D3, but may be much more positive than this value, and no unwanted effects will occur.

Also from the above description it may be observed that, except for certain maximum or minimum values, the tolerances on the circuit parameters are not stringent. Substantially no output pulse or a full output pulse is generated in accordance with whether the gating input signal is of relatively positive or negative potential, respectively.

If the potential at point 2 is relatively negative (at ground potential) at the time an actuating pulse is applied, but simultaneously with the application of the actuating pulse becomes positive, diode D2 will be caused to be in the high-resistance condition during the time of the actuating pulse, but there will be no effect on the transmission of the actuating pulse from terminal 5 to the output terminal 4. In other words, the gate produces a response in accordance with the potential at point 2 which exists at the beginning of the actuating pulse. If the potential at point 2 is initially at its relatively positive value at the time an actuating pulse is applied, but simultaneously with the application of the actuating pulse is changed to its relatively negative potential, there will be no transmission of the actuating pulse to the output terminal provided only that the rate of potential change of point 2 does not exceed the rate of potential change of the actuating pulse. If this condition is fulfilled, diode D2 will remain in the high-resistance condition, and the operation of the gate will again be dependent only on the value of the potential at point 2 at the initiation of the actuating pulse. The requirements on the relative rates of potential change are not difficult to meet because the source of actuating pulses may be readily designed as required, and because in the applications for which the gate circuit is intended the gating input signal change is a result of the action of the actuating pulse and therefore begins to occur slightly after the actuating pulse.

Figure 2:
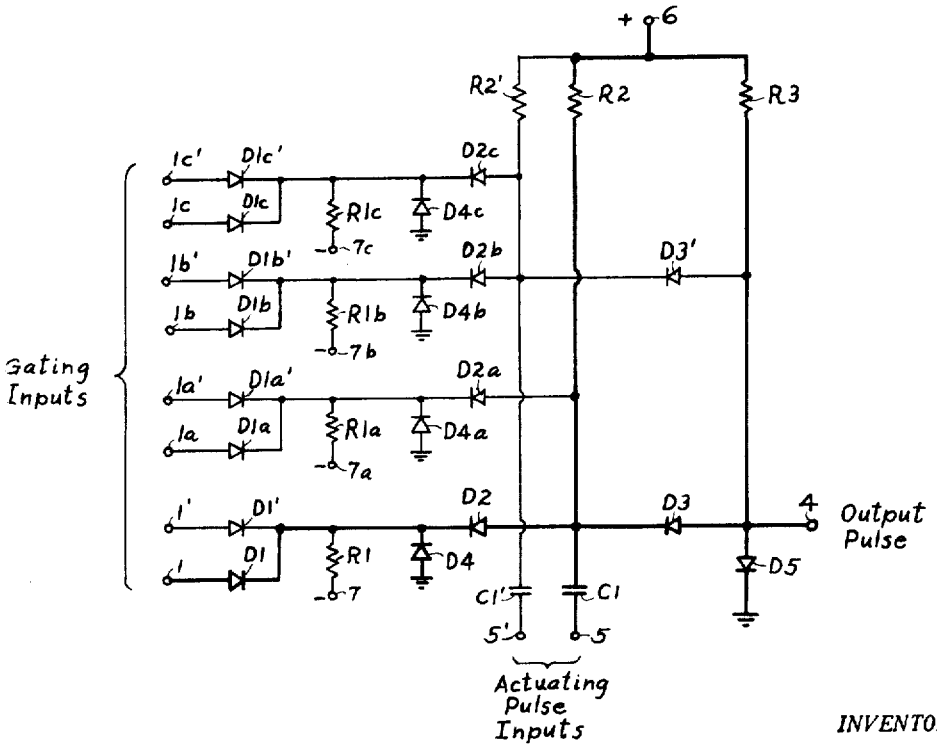
FIG. 2 is a circuit diagram of a diode pulse gating circuit for performing logical functions.

Although the gating circuit as described requires a rather large number of diodes in order to achieve its advantages, the functions of "and" and "or" can be added to the gating input with only a small amount of additional components, so that in many applications the total amount of components required is relatively small in view of the functions performed. FIG. 2 shows such a circuit for performing the logical functions of "and" and "or," the portion of this circuit which corresponds to FIG. 1 being shown in heavy lines and having the same reference characters as in FIG. 1. Specifically, as shown in FIG. 2, a diode D1' is connected between point 2 and an additional input terminal 1'. With this connection, the potential of point 2 will be at ground only if both of the input signals applied at input terminals 1 "and" 1' are at ground or more negative. Since the actuating pulse will be gated to the output terminal only under this condition, the two diodes perform an "and" function. A diode D2a is connected between point 3 and a point 2a which corresponds to the point 2 already described. A resistor R1a and diodes D1a, D1a' and D4a are connected to the point 2a in a manner similar to the connections of the previously described elements to the point 2. A diode D3' is connected between terminal 4 and a point 3' which corresponds to the point 3 already described. A resistor R2' is connected between the point 3' and the terminal 6, and a capacitor C1' is connected between the point 3' and an actuating pulse input terminal 5'. A circuit comprising the elements D2b, D4b, etc. is connected to the point 3'; this circuit corresponds to the gating input circuit, already described, which is connected to the terminal 3. Likewise, a similar gating input circuit comprising the elements D2c, D4c, etc. is connected to the point 3'. The several gating input circuits provide four pairs of gating input terminals 1 and 1'; 1a and 1a'; 1b and 1b'; and 1c and 1c'. Each of these pairs of gating input terminals provides for the performance of an "and" function in the manner already described.

In the circuit of FIG. 2, the potential of point 3 will be held at ground if the potential of either point 2 "or" point 2a is at ground potential. The actuating pulse at terminal 5 will pass to the output terminal 4 in either case, so that diodes D2 and D2a perform an "or" function. An "or" function is similarly performed by the diodes D2b and D2c which are connected to the point 3'. A negative pulse appearing at either point 3 "or" point 3' will cause a negative pulse to occur at the output terminal 4, thus providing an additional "or" function.

In the application for which the gating circuit is primarily intended, the gating input signals preferably are supplied from cathode follower circuits which are in turn driven by flip-flops. In this case, resistor R1 and the corresponding resistors in the other gate circuits form the load resistances in the cathode follower circuits, and no separate load is required. Since the only requirement on resistor R1 is that its resistance be smaller than a certain value with respect to R2, and since R2 may be of high resistance, the load on the driving circuit is small. One cathode follower may therefore drive many such diode gating circuits. A limitation to this property is encountered when very high pulse repetition rates are to be used. In this case there are maximum limits on the permissible resistance value of R2 and also of R1 because of the need to recharge capacitors C1 and C1' from current that must pass through resistor R2. In the intended application, the pulse output signals are transmitted through capacitors to the grid input lines of flip-flop circuits in a conventional manner.

It is to be understood that the disclosed arrangement is illustrative of the preferred embodiments of the invention. Other embodiments, notably the addition of more input lines, the insertion of more logical functions, the branching of output lines, and the use of opposite polarity for the components and operating voltages, may be devised by those skilled in the art without departing from the spirit and scope of the invention as defined in the claims.

What is claimed is:

1. A gating circuit comprising a resistor and a first diode connected in series to form a series combination, a voltage supply source connected to apply a voltage across said series combination to cause a current to normally flow therethrough, a second diode having an electrode connected to the junction of said first diode and said resistor, like electrodes of said first and second diodes being connected to said junction, a source of pulses, means connected to apply said pulses whenever they occur to the remaining electrode of said second diode, said pulses having a polarity in the conductive direction of said second diode, a second resistor connected between said remaining electrode of the second diode and the end of said first-named resistor which is remote from said junction, a third diode having an electrode connected to said remaining electrode of the second diode whereby unlike electrodes of said second and third diodes are connected together, a voltage supply source connected to the remaining electrode of said third diode with a polarity to render said third diode normally conductive whereby said second diode is rendered normally conductive for said pulses, and means connected to said remaining electrode of the third diode to selectively apply a voltage thereto for rendering said third diode nonconductive whereby said second diode is rendered non-conductive for said pulses.

2. A gating circuit comprising a resistor and a first diode connected in series to form a series combination, a voltage supply source connected to apply a voltage across said series combination to cause a current to normally flow therethrough a second diode having an electrode connected to the junction of said first diode and said resistor, like electrodes of said first and second diodes being connected to said junction, a source of pulses, means connected to apply said pulses whenever they occur to the remaining electrode of said second diode, said pulses having a polarity in the conductive direction of said second diode, a second resistor connected betwen said remaining electrode of the second diode and the end of said first-named resistor which is remote from said junction, a third diode having an electrode connected to said remaining electrode of the second diode whereby unlike electrodes of said second and third diodes are connected together, a third resistor connected at an end thereof to the remaining electrode of said third diode, a voltage supply source connected to the remaining end of said third resistor with a polarity to render said third diode normally conductive whereby said second diode is rendered normally conductive for said pulses, and means connected to said remaining electrode of the third diode to selectively apply a voltage thereto for rendering said third diode non-conductive whereby said second diode is rendered non-conductive for said pulses.

3. A gating circuit comprising a resistor and a first diode connected in series to form a series combination, a voltage supply source connected to apply a voltage across said series combination to cause a current to normally flow therethrough, a second diode having an electrode connected to the junction of said first diode and said resistor, like electrodes of said first and second diodes being connected to said junction, a source of pulses, means connected to apply said pulses to the remaining electrode of said second diode, said pulses having a polarity in the conductive direction of said second diode, a second resistor connected between said remaining electrode of the second diode and the end of said first named resistor which is remote from said junction, a third diode having an electrode connected to said remaining electrode of the second diode whereby unlike electrodes of said second and third diodes are connected together, a third resistor connected at an end thereof to the remaining electrode of said third diode, a voltage supply source connected to the remaining end of said third resistor with a polarity to render said third diode normally conductive whereby said second diode is rendered normally conductive for said pulses, a fourth diode connected between said remaining electrode of the third diode and the electrode of said first diode which is remote from said junction, like electrodes of said third and fourth diodes being connected together and unlike electrodes of said first and fourth diodes being connected together, a gating input terminal, and a fifth diode connected between said gating input terminal and the junction of said third and fourth diodes, like electrodes of said third, fourth and fifth diodes being connected to said last-named junction.

4. A gating circuit comprising a first voltage terminal, a first resistor and a first diode connected in series between said first voltage terminal and electrical ground with an electrode of said first diode being connected to electrical ground, means connected to apply a voltage to said first voltage terminal with a polarity to cause a current to normally flow through said first diode, a second resistor and a second diode connected in series between said first voltage terminal and the junction of said first resistor and said first diode, like electrodes of said first and second diodes being connected together, a source of pulses, means connected to apply said pulses whenever they occur to the remaining electrode of said second diode, said pulses having a polarity in the conductive direction of said second diode, a third diode having an electrode connected to said remaining electrode of the second diode whereby unlike electrodes of said second and third diodes are connected together, a second voltage terminal, a third resistor connected between said second voltage terminal and the remaining electrode of said third diode, means connected to apply a voltage to said second voltage terminal with a polarity opposite to the polarity of the voltage applied to said first voltage terminal thereby to render said third diode normally conductive whereby said second diode is rendered normally conductive for said pulses, and means connected to said remaining electrode of the third diode to selectively apply a voltage thereto for rendering said third diode non-conductive whereby said second diode is rendered non-conductive for said pulses.

5. A circuit as claimed in claim 4, in which said last-named means comprises a fourth diode connected between electrical ground and said remaining electrode of the third diode, a gating input terminal, and a fifth diode connected between said gating input terminal and the junction of said third and fourth diodes, like electrodes of said third, fourth and fifth diodes being connected to said last-named junction.

6. A gating circuit for performing logical functions, comprising a resistor and a first diode connected in series to form a series combination, a voltage supply source connected to apply a voltage across said series combination to cause a current to normally flow therethrough, second and third diodes each having an electrode connected to the junction of said first diode and said resistor, like electrodes of said first, second and third diodes being connected to said junction, means connected to apply pulses to the remaining electrodes of said second and third diodes with a polarity in the conductive directions of said second and third diodes, a first gating means connected to said remaining electrode of the second diode and adapted to selectively bias said remaining electrode of the second diode in a condition to render said second diode conductive for said pulses and in a condition to render said second diode non-conductive for said pulses, and a second gating means connected to said remaining electrode of the third diode and adapted to selectively bias said remaining electrode of the third diode in a condition to render said third diode conductive for said pulses and in a condition to render said third diode non-conductive for said pulses.

7. A gating circuit for performing logical functions, comprising a resistor and a first diode connected in series to form a series combination, a voltage supply source connected to apply a voltage across said series combination to cause a current to normally flow therethrough, a second diode having an electrode connected to the junction of said first diode and said resistor, like electrodes of said first and second diodes being connected to said junction, a source of pulses, means connected to apply said pulses to the remaining electrode of said second diode, said pulses having a polarity in the conductive direction of said second diode, a second resistor connected between said remaining electrode of the second diode and the end of said first-named resistor which is remote from said junction, third and fourth diodes each having a like electrode connected to said remaining electrode of the second diode whereby said remaining electrode of the second diode is connected to unlike electrodes of said third and fourth diodes, means connected to bias the remaining electrodes of said third and fourth diodes with a polarity to render said third and fourth diodes normally conductive whereby said second diode is rendered normally conductive for said pulses, and means respectively connected to said remaining electrodes of the third and fourth diodes to selectively apply voltages thereto for rendering said third and fourth diodes selectively non-conductive.

8. A gating circuit for performing logical functions, comprising a resistor and a first diode connected in series to form a series combination, a voltage supply source connected to apply a voltage across said series combination to cause a current to normally flow therethrough, a second diode having an electrode connected to the junction of said first diode and said resistor, like electrodes of said first and second diodes being connected to said junction, a source of pulses, means connected to apply said pulses to the remaining electrode of said second diode, said pulses having a polarity in the conductive direction of said second diode, a second resistor connected between said remaining electrode of the second diode and the end of said first-named resistor which is remote from said junction, a third diode having an electrode connected to said remaining electrode of the second diode whereby unlike electrodes of said second and third diodes are connected together, a third resistor connected at an end thereof to the remaining electrode of said third diode, a voltage supply source connected to the remaining end of said third resistor with a polarity to render said third diode normally conductive whereby said second diode is rendered normally conductive for said pulses, a fourth diode connected between said remaining electrode of the third diode and the electrode of said first diode which is remote from said junction, like electrodes of said third and fourth diodes being connected together and unlike electrodes of said first and fourth diodes being connected together, first and second gating input terminals, fifth and sixth diodes respectively connected between said first and second gating input terminals and the junction of said third and fourth diodes, like electrodes of said third fourth, fifth and sixth diodes being connected to said last-named junction.

*9. A gating circuit comprising pulse input means, pulse output means, gating signal input means, means causing the potential of said pulse output means to be limited to a preselected value in one direction as regards to positive and negative, means tending to pull the potential of said output means in said direction away from said preselected value, two diodes in a series connection with unlike electrodes of said diodes connected together at a junction and with one end of said series connection connected to said gating signal input means and the other end of said series connection connected to said pulse output means and with the polarity of said diode connections being such that when the potential of said gating signal input means is maintained at a second value which is in said direction with respect to said preselected value the diodes are in the high resistance condition, a resistor connected between said junction and a potential source the potential of which is in said direction with respect to said preselected value, and a capacitor connected between said junction and said pulse input means.*

*10. A gating circuit as in claim 9 where said means for causing the potential of said pulse output means to be limited to a preselected value comprises a diode connected between said pulse output means and a potential source of said preselected value.*

*11. A gating circuit as in claim 9 where said means tending to pull the potential of said output means in said direction away from said preselected value comprises a resistor connected between said output means and a potential source the potential of which is in said direction with respect to said preselected value.*

References Cited by the Examiner

The following references, cited by the Examiner, are of record in the patented file of this patent or the original patent.

UNITED STATES PATENTS

| | | | |
|---|---|---|---|
| 2,618,753 | 11/52 | Mierlo | 307—115 |
| 2,636,133 | 4/53 | Hussey | 307—88.5 |
| 2,657,318 | 10/53 | Rack | 307—88.5 |
| 2,685,039 | 7/54 | Scarborough et al. | |
| 2,752,530 | 6/56 | Aigrain | 328—94 XR |
| 2,773,982 | 12/56 | Trousdale | 307—88.5 |
| 2,853,630 | 9/58 | Lane et al. | |
| 2,924,704 | 2/60 | Horowitz et al. | 325—22 |

OTHER REFERENCES

Millman and Taub: Pulse and Digital Circuits, McGraw-Hill, 1956 (pp. 119–126, 433–435 relied on).

ARTHUR GAUSS, *Primary Examiner.*